United States Patent
Sachdev et al.

(10) Patent No.: US 7,312,261 B2
(45) Date of Patent: Dec. 25, 2007

(54) THERMAL INTERFACE ADHESIVE AND REWORK

(75) Inventors: Krishna G. Sachdev, Hopewell Junction, NY (US); Daniel George Berger, New Paltz, NY (US); Kelly May Chioujones, San Diego, CA (US); Glenn Graham Daves, Fishkill, NY (US); Hilton T. Toy, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 442 days.

(21) Appl. No.: 10/709,518

(22) Filed: May 11, 2004

(65) Prior Publication Data

US 2005/0256241 A1 Nov. 17, 2005

(51) Int. Cl.
C08L 63/00 (2006.01)
C08K 3/08 (2006.01)
C08K 7/00 (2006.01)
B32B 27/38 (2006.01)

(52) U.S. Cl. ............... 523/457; 523/435; 525/476; 525/529; 428/414

(58) Field of Classification Search ............... 523/400, 523/435, 440, 457, 458, 459, 468; 525/476, 525/523, 529, 530, 533; 428/413, 414, 416, 428/418
See application file for complete search history.

(56) References Cited

U.S. PATENT DOCUMENTS

| | | | |
|---|---|---|---|
| 4,649,992 A | | 3/1987 | Geen et al. |
| 5,700,581 A | | 12/1997 | Sachdev et al. |
| 5,853,888 A | | 12/1998 | Dutta et al. |
| 6,118,177 A | | 9/2000 | Lischner et al. |
| 6,548,175 B2 | | 4/2003 | Sachdev et al. |
| 6,652,665 B1 | | 11/2003 | Sachdev et al. |
| 6,977,025 B2 * | | 12/2005 | McArdle et al. ......... 156/272.2 |
| 2002/0143092 A1 | | 10/2002 | Matayabas, Jr. |
| 2002/0171132 A1 * | | 11/2002 | Buchwalter et al. ........ 257/678 |
| 2003/0041442 A1 | | 3/2003 | McCullough |
| 2003/0067069 A1 | | 4/2003 | Lebonheur et al. |
| 2003/0068487 A1 | | 4/2003 | Nguyen et al. |

* cited by examiner

*Primary Examiner*—Michael J. Feely
(74) *Attorney, Agent, or Firm*—Kerry B. Goodwin

(57) ABSTRACT

A reworkable conductive adhesive composition, and method of making such, comprising an epoxy based conductive adhesive containing conductive metal filler particles dispersed in a solvent-free hybrid epoxy polymer matrix. In an additional embodiment an improved method of removing cured conductive polymer adhesives, disclosed here as thermal interface materials, from electronic components for reclamation or recovery of usable parts of module assemblies, particularly high cost semiconductor devices, heat sinks and other module components.

1 Claim, 3 Drawing Sheets

THERMAL INTERFACE ADHESIVE AND REWORK

BACKGROUND OF INVENTION

This invention relates to conductive adhesives for the thermal interface between a silicon device and a heat sink/heat spreader in microelectronic assemblies. More particularly, this invention is directed to conductive adhesives with improved functional performance and a method to rework the cured adhesives to allow recovery, recycle, or reuse of the heat sink assembly components without causing any detriment to the device chip or the chip carrier.

The rapid technology advancements in high performance electronics packaging has focused on reduced size and higher operating speed. This has resulted in excessive heat generation during device operation. There is an accompanying need for effective heat dissipation methods to maintain the reliable functional performance of electronic assembly products. The commonly used methods of cooling include helium filled modules, solder thermal interfaces, thermal greases, elastomeric silicone gels, thermoplastic polymers with thermally conductive fillers such as AlN, BN, ZnO, and more recently, phase change materials (PCM), and conductive adhesives. These provide the thermal interface between the silicon device chip and a high thermal conductivity metal heat spreader or heat sink to allow a path for heat dissipation from the high power density circuit devices during operation.

Thermal grease is spread as a thin layer between the back of the die and the heat sink. Thermal grease has low thermal resistance and can be easily reworked. However, it is subject to pump-down and drying which causes voids at the interface. This degrades the device performance with time due to an increase in interfacial resistance. The phase change materials (PCM) are low melting waxes. Examples include paraffin wax, having graphite particles dispersed in the wax polymer matrix, and silicone based waxes, such as alkyl methyl silicones, which can be used as pre-formed tapes or melt dispensed across interfaces. They provide low thermal impedance and high thermal conductivity, typically in the range 5 W/m° K in thin bond line thickness. However the pre-cut films of these materials are fragile and also have the problem of performance degradation and variability, delamination, bleed-out, out-gasing, and generally require fasteners, clips or screws to hold the PCM in place.

Another category of thermal interface materials are conductive adhesives which can be used as a thin adhesive interlayer between the heat sink or the heat spreader and the back side of a silicon die in a flip-chip module assembly. The commercially available conductive adhesives are typically Ag-filled and ceramic-filled epoxy based materials including flexible epoxies. They are medium to high modulus adhesives (>100,000 psi at room temperature). It is generally known that cured coatings of such materials have high intrinsic stress which can cause disruption of interface integrity due to delamination. This results in increased contact resistance with a corresponding decrease in the heat dissipation effectiveness at the interface. The commercially available Ag-filled adhesives also have no simple and practical rework method available. Therefore they cannot be readily removed or reworked from contacting surfaces. The non-reworkability of these adhesives present a serious drawback in that it does not allow for defect repair or component recovery, recycle or reuse of high cost semiconductor devices, heat sinks and substrates.

The most desired improvements in the thermal interface material properties include: ability to form thin bond line with uniform thickness across interfaces, low thermal impedance, low stress and compliant systems for interface integrity during device operation, stable interfacial contact resistance in T/H (temperature-humidity) and T/C (thermal cycling), TCR stability (temperature coefficient of resistance), and reworkability for defect repair and reclamation of high cost module components. The preferred materials should also be amenable to removal from contacting surfaces to allow rework without causing any detriment to the module materials for defect repair, chip replacement, and recovery of high cost components, particularly special type heat spreaders having high thermal conductivity and chip joined modules for reclamation and reuse.

The ability to rework and recover components has become more important to recover production yield loss, reduce waste, and provide cost reduction in the fabrication of advanced technology high performance electronic products. Commonly used high thermal conductivity heat spreader materials include AlSiC, SiC (k=270), SiSiC (k=210), AlN, Al, Cu and other special types having low thermal expansion and high thermal conductivity, for example, CuW, diamond-SiC, surface metallized diamond such as with Ni, Cr, CrNiAu, diamond-like carbon etc., to confer other desirable properties as corrosion resistance and adhesion improvement. With the use of high cost diamond based heat spreaders which have the highest thermal conductivity of all other common type of heat sinks employed, having a rework option for the cured conductive films offers a major benefit of recovery/reclamation and reuse, thus providing a cost effective way to obtain significant increase in heat dissipation capability with the use of high thermal conductivity cooling element in conjunction with a thermal interface adhesive.

In view of the limitations in the use of conventional interface materials, there is a need for improved thermal interface materials (TIMs) with efficient heat dissipation from high power density devices. There is also a need for a practical method to rework the cured deposits/residue of these materials from various component surfaces/interfaces the materials are adhered to.

SUMMARY OF INVENTION

The purposes of the present invention have been achieved by providing, according to the present invention, a re-workable conductive adhesive composition comprising an epoxy based conductive adhesive containing conductive metal filler particles dispersed in a solvent-free hybrid epoxy polymer matrix.

In another aspect of the present invention there is provided a method for making a conductive adhesive composition comprising the steps of;

mixing a liquid epoxy precursor and a polymer additive to form a first mixture;

stirring said first mixture at at least room temperature until it forms a first homogeneous blend;

adding a anhydride curing additive to said first homogeneous blend to form a second mixture;

stirring said second mixture at at least room temperature until it forms a second homogeneous blend;

adding a epoxy curing catalyst to said second homogeneous blend to form a third mixture;

stirring said third mixture until it forms a third homogeneous blend, and adding conductive metal filler particles in said third homogeneous blend to form a conductive adhesive composition.

In another aspect of the present invention there is provided a conductive adhesive rework method comprising the steps of:

(a) providing a first cleaning solution for a thermal interface cured coating/residue deposit on assembly components which comprises tetramethylammonium fluoride (TMAF) or tetrabutylammonium fluoride (TBAF), tetra-n-octylammonium fluoride (TOAF) or a mixture thereof dissolved in a first essentially water insoluble non-hydroxylic aprotic solvent;

(b) submerging said assembly components carrying said cured coating/residue of conductive adhesive thermal interface material in said first cleaning solution heated at approximately 40 to 70° C. and allowing said assembly components to be subjected to the cleaning action by said first cleaning solution with stirring or agitation for a first predetermined period of time between about 10 to about 90 minutes;

(c) removing said assembly components from said first cleaning solution;

(d) transporting and submerging said assembly components in a first solvent rinse bath which comprises a hydrophobic non-hydroxylic solvent and subjecting said assembly components to said first solvent rinse at approximately room temperature to 70° C. with agitation, for a second predetermined period of time between approximately 5 to 15 minutes, to replace said first cleaning solution on the assembly component surface with said first solvent rinse;

(e) removing said assembly components from said first solvent rinse bath;

(f) transporting and submersing said assembly components to a second solvent rinse bath which comprises a hydrophilic essentially water soluble solvent, and subjecting said assembly components to a second solvent rinse at approximately room temperature to 60° C. with agitation such as stirring or immersion spray for approximately 5 to 10 minutes;

(g) removing said assembly components from said second solvent rinse bath;

(h) transporting said assembly components to an aqueous rinse bath and applying a water rinse, spray or immersion spray rinse, at approximately room temperature to 50° C. for approximately 2 to 10 minutes;

(i) subjecting said assembly components to a third rinsing step with IPA (isopropanol) to replace water on said component assembly surface with IPA to accelerate drying;

(j) drying said assembly components by blowing dry $N_2$ or air on the surfaces and then heating said assembly components to approximately 90° C. to 120° C. for approximately 30 minutes to one hour to remove adsorbed moisture from said assembly components.

In another aspect of the present invention there is provided an electronic package assembly comprising a substrate having electronic conductors, electronic device chips bonded to substrate and a heat spreader/heat sink attached to back of device chips with a reworkable conductive adhesive composition comprising an epoxy based conductive adhesive containing conductive metal filler particles dispersed in a solvent-free hybrid epoxy polymer matrix.

In another aspect of the present invention there is provided a method for assembling an electronic package wherein a heat sink is attached to the back of device chips with a reworkable conductive adhesive as the thermal interface comprising the steps of:

applying a thin layer of a reworkable conductive adhesive paste by dispensing or screen printing on the heat spreader or on the back of device chips mounted on a chip carrier;

securing said adhesive coated chips mounted on a chip carrier in a clamping fixture with slots matching the chip carrier size to prevent any movement;

aligning said heat sink with the back of said chips, placing in contact with said adhesive coated chip surface and clamping said heat sink/chip carrier assembly to prevent component movement and provide pressure during subsequent curing;

placing said heat sink/chip carrier assembly in a preheated oven at approximately 90-100° C., holding at this temperature for approximately 45 minutes, then ramping the temperature to approximately 160-170° C. and holding at this temperature for approximately 60-90 minutes to complete cure of the interface adhesive.

Alternatively, the method comprises applying a thin layer of a reworkable conductive adhesive paste on both the backside of the silicon device chip and the heat spreader side; aligning and assembling the components and curing the thermal interface adhesive to obtain an electronic package wherein a heat sink is attached to the back of device chips with a reworkable conductive adhesive as the thermal interface.

DETAILED DESCRIPTION

Figure 1:
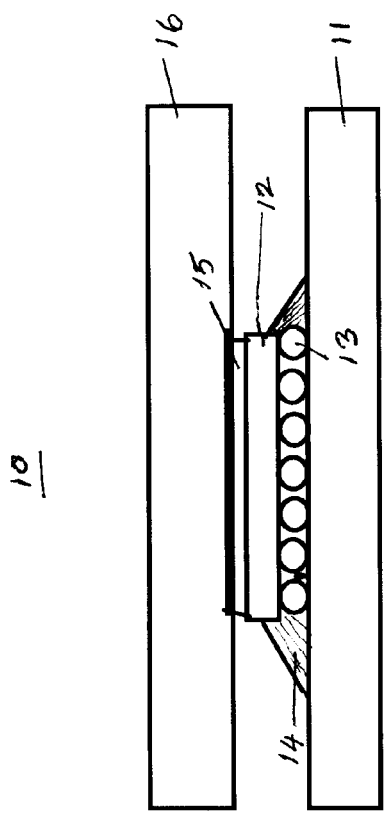
FIG. 1 is a cross section of a single chip module with a metal plate attached to the back of the chip with conductive adhesive as thermal interface.

The reworkable conductive adhesive compositions according to this invention are multi-component paste formulations containing a high level of metal flake and/or powder filler dispersed in a polymer matrix derived from a liquid epoxy precursor preferably having a siloxane linkage (—Si—O—Si—) and carrying an acyclic or alicyclic chain segment, standard solid or liquid anhydride or an amine curing additive, a conventional epoxy curing catalyst, a polymer additive which is completely miscible in the epoxy precursor, the later is added for matrix viscosity adjustment without the need to add a solvent, and the additive is also found to provide improvement in the conductive adhesive properties.

These reworkable conductive adhesives, used as thermal interface materials, have shown superior properties as interface bonding materials for cooling plate/heat sink attachment to flip-chip in a single chip module (SCM), dual chip module (DCM) or an array of chips in a multi-chip module assembly (MCM). The cured adhesives can be readily removed from various heat sink surfaces and Si die backing by exposing the disassembled components to a dilute solution of a quaternary ammonium fluoride in a non-polar aprotic solvent for a brief period of time followed by rinsing with isopropyl alcohol (IPA) and drying.

The present invention also offers a major advantage of a reworkability option, which is especially important in the recovery and reuse of the more expensive high thermal conductivity diamond based heat sinks and other module components. Most of the commercial epoxy based conductive adhesives for thermal interface applications have high modulus and thus higher stress and present the problem of delamination under stress exposure, and the cured adhesives cannot be readily removed from the joining surfaces.

The thermal interface materials of this invention are conductive adhesives formulated by dispersing conductive metal filler particles in a solvent-free polymer matrix to obtain polymer-filler composite paste of desired viscosity for the selected application. The polymer matrix used for these conductive adhesive compositions is a multi-component system with viscosity suitable for dispersing a high level of metal flake and/or powder filler, the polymer matrix being derived from liquid epoxy precursors admixed with standard solid or liquid anhydride or an amine curing additive which are soluble in the liquid epoxy, a standard epoxy curing catalyst, and a low molecular polymeric additive such that it forms a completely miscible blend with the rest of the binder matrix and having the desired viscosity to allow optimum conductive pasteviscosity with high level of metal filler loading without the need to add a solvent.

These compositions have the unique complement of properties desired for an improved TIM, particularly, low intrinsic stress, high thermal conductivity, no resin bleed during cure. The composite paste viscosity can be adjusted to provide thin bond line (<1 mil cured thickness) or thicker bond line (>1 mil), have low resistivity generally in the range $10^{-5}$ Ω-cm, have high thermal conductivity (>3W/m° K) for enhanced heat dissipation, stable interface thermal resistance, and good adhesion to all relevant surfaces, particularly Si chip backing and heat sink metals, and adhesion durability under reliability stress excursions involving T/H (85° C./85%) and thermal cycling.

The polymer additive can be fully functionalized or have residual reactive sites which forms an interpenetrating network (IPN) upon curing of the conductive adhesive and affects the functional properties of the adhesive.

Preferred metal fillers for conductive paste compositions include Pd-coated Ag, Au-coated Ag, Ag, Ag-coated Cu, spherical Ag powder, carbon fibers, particularly carbon microfibers, and combination thereof. The filler can also be a combination of electrically conductive metal and thermally conductive/electrically insulative inorganic filler such as BN, AlN, where the filler can be in the form of flake, powder, hollow spheres, or fibers. The particle size of the filler can be primarily monodisperse or polydisperse phase with varying particle size distribution, shape and morphology. The fillers that have average particle size less than 10 μm and have narrow particle size distribution that assures high packing density are preferred. The Pd or Au are preferably in an amount in the range of 5 to 20 wt % relative to Ag. The particle size of the metal filler varies in the range 2-30 μm.

The polymer matrix composition of this invention can allow dispersion of these fillers at a level ranging from 70-90% (wt %) without causing brittleness, and enhanced thermal conductivity coatings are obtained at high particle loading levels, preferably in the range 82-88% (wt. %).

The organic matrix binder system of the conductive adhesive compositions as thermal interface materials for heat dissipation according to this invention is based on epoxy-low Tg compliant polymer additive which is prepared using commercially available precursor materials which are, liquid epoxide, conventional anhydride and amine curing agent, polymer additive material of select chemistry, curing catalyst/cure accelerator system.

Preferred liquid epoxide precursors are: bis(1,3-glycidoxy propyl) tetramethyl disiloxane; aliphatic diglycidyl ethers such as bis(1,4-butane diol) diglycidyl ether and mixture thereof; bis(1,5 glycidoxy propyl)hexamethyl trisiloxane; 1,4-cyclohexane-dimethyl diglycidyl ether and related liquid cycloaliphatic diepoxides.

The curing agents used are preferably saturated aliphatic anhydrides which may be liquid or low melting solids which are miscible with the liquid epoxy precursor and forms a stable homogeneous mixture at room temperature or by heating up to 70-80° C. Representative candidates for suitable anhydrides include: hexahydrophthalic anhydride (HHPA), hexahydro-4-methyl phthalic anhydride (MeHHPA), dodecynylsuccinic anhydride (DDSA); octenyl succinic anhydride; hexadecenyl succinic anhydride; cis-4-cyclohexane-1,2dicarboxylic anhydride or cis-1,2,3,6-tetrahydrophthalic anhydride (THPA); methyl-5-norbornene-2,3-dicarboxylic anhydride; maleic anhydride, and mixtures thereof.

The polymeric additive used in these epoxides can be an acrylate polymer such as polyacrylate, poly(n-butylacrylate or n-butylmethacrylate) of low molecular weight preferably having intrinsic viscosity <0.5; poly(n-fluorobutyl methacrylate), low molecular weight poly(methyl methacrylate) preferably having molecular weight <10,000, and mixtures thereof. Conductive adhesive compositions using this class of polymer additive have been described previously in U.S. Pat. No. 6,548,175.

According to the present invention, it is discovered that alternate the low Tg oligomeric additives having residual functional groups, specifically poly(acrylonitrile-co-butadiene-co-acrylic acid, dicarboxy terminated glycidyl methacrylate diester (ABA-glycidyl methacrylate diester) form a highly compatible blend with the epoxy precursor and provide improved adhesive properties of the conductive adhesives derived therefrom when used with anhydride curing system, while another functionalized oligomeric additive amine terminated poly(acrylonitrile-co-butadiene) can be used with advantage in amine curing conductive adhesive compositions. The low Tg polymer/oligomeric additive is in the range 5% (wt %) to about 30% (wt %), preferably in the range 10 wt % to 20 wt % by weight of the epoxy-polymer additive mixture, the rest being the epoxy precursor.

It is also found that in the anhydride curing formulations, using a mixture of anhydrides, for example, MeHHPA and HHPA; DDSA and HHPA; or MeHHPA and MA results in superior conductive adhesive properties than is generally observed with using a single type of anhydride curing agent. The preferred mole ratio of the anhydride curing agent to the epoxy equivalent is in the range 1:1 to 1:2, respectively. When using a mixture of two anhydrides, the relative ratio of the anhydrides can be in the range 1:2 to 2:1.

Preferred Au-coated Ag filler have about 10% Au and 90% Ag, which has 50% particle size <2.4 µm, 95% is <5.9 µm, and 10% is <0.77 µm. Depending on the particle size, distribution, and morphology, the polymer matrix composition of this invention can allow dispersion of filler at a level ranging from 70-90% (wt %) to obtain conductive paste viscosity suitable for manual dispense, screen or stencil printing, or with an auto-dispense tooling. Typical viscosity of freshly formulated conductive adhesives for thermal interface application can be in the range 20,000 to 60,000 Pa/S.

In a representative example of preparing the conductive adhesive paste formulation, 5% to about 30% (wt %) of the polymeric/oligomeric additive is added to the liquid epoxide and the mixture allowed to stir at room temperature or at elevated temperature till it forms a homogeneous blend. The anhydride curing additive is then added and the mixture is stirred at about 50-70° C. for 30 minutes to completely dissolve the anhydride.

In an alternate procedure, epoxy/anhydride mixture is formed first and then the polymeric/oligomeric additive is blended in with mechanical mixing till a clear mixture is formed without requiring solvent addition. A catalyst/accelerator system used in conjunction with anhydride curing epoxy formulations is added which commonly includes a tertiary amine, typically, 2,4,6-tris(dimethylaminomethyl) phenol, benzyldimethyl amine (BDMA), 2,6-diaminopyridine along with a proton source, typically nonylphenol, ethylene glycol, resorcinol, and related materials. The amine accelerator can be in the range 0.02 to 0.5% (wt %) of the epoxy-polymer additive-anhydride mixture. The proton source used in conjunction with the amine catalyst can be in the range 0.1 to 1.0% of the total organic binder mixture.

All the organic components are thoroughly mixed together and the catalyzed system can either be used immediately for dispersing the metal filler to form conductive paste or it can be stored at −20 or −40° C. for later use. Conductive metal filler is then dispersed in the catalyzed organic matrix by adding in portions and constant mixing with a rotary mixer, the amount of metal filler added varies between 70-85 wt % depending on the filler type, to obtain paste viscosity suitable for forming a defect-free thin bond line coatings by manual dispense, syringe dispensing or screen printing on silicon chip and metal heat sink surfaces. After a homogeneous paste consistency is obtained for a desired application, the paste is deairated to remove any trapped air and stored at a minimum of 40° C. when not in use.

Curing and characterization of representative conductive adhesives described here for thermal interface application was conducted by forming thin coatings on glass slides, ceramic substrates, silicon wafers, and on various metal heat sinks, and subjecting them to thermal treatment at 90-100° C. for 30 minutes followed by 160-175° C. for 60-90 minutes, preferably in a $N_2$ purged oven. Curing behavior of the adhesives was evaluated by differential scanning calorimetry (DSC) which showed exothermic transition with peak temperature ranging from 150° C. to 175° C. for the anhydride cure adhesives, the heat generally observed was in the range 35 to 60 J/g depending on the adhesive chemistry. Thermal stability was tested by carrying out thermogravimetric analysis (TGA) from room temperature to 250° C. at 10°/min ramp rate and also by isothermal TGA at 180° C. for extended period of time.

The TGA data for specific materials are provided in table 1. For resistivity measurements, the adhesives pastes were dispensed onto glass slides to form strips having about 4 cm length, 1 cm width and 0.8 to 1.2 mil wet thickness which on curing gives <1 mil coating thickness.

A typical test method for the use of these adhesives as thermal interface materials in heat sink attachment involved dispensing the conductive paste onto the back side of silicon chip, size 18 $mm^2$ or 15.2 mm by 16.2 mm x,y size, mounted on a ceramic chip carrier (alumina ceramic, 42.5 by 42.5 mm, 2 mm thick substrate) by C4 Pb/Sn solder (97% Pb/3% Sn), or on a heat sink surface, spreading the paste to form a thin uniform layer, securing the coated component in a fixture with individual slots and placing a SiSiC heat sink/heat spreader on top in alignment with the chip backing and secure the assembly by clamp down without disrupting the adhesive contact interface. The assembly is then cured in a $N_2$ purged oven 100-110° C. for 40 minutes followed by 160-170° C. for 90 minutes, allowed to cool down to at least 80° C. before removing the clamps. Shear strength is measured according to standard method of tensile pull using Instron. The relevant time zero measurement data are shown in table 1.

TABLE 1

| Example | Anhydride Curing Agent[a] | Polymer additive[c] | Conductive Metal Filler | TGA Rt-250° % wt loss | TGA Isothermal/ hr, 180° C. | Shear strength, Psi |
| --- | --- | --- | --- | --- | --- | --- |
| 1 | MeHHPA + HHPA | n-BuMA polymer | Au-coated Ag flake/powder | 0.59 | 0.21 | 2050 |
| 2 | MeHHPA + HHPA + NMA | n-BuMA polymer | Au-coated Ag flake/powder | 1.0 | 0.25 | 1250 |
| 3 | DDSA + MA | n-BuMA polymer | Au-coated Ag flake/powder | 0.5 | 0.15 | 1400 |
| 4 | DDSA | n-BuMA polymer | Pd-coated Ag Flake/powder | 0.55 | 0.2 | 1300 |
| 5 | HHPA | ABGMA oligomer | Au-coated Ag Flake/powder | 0.5 | 0.18 | 1950 |
| 6 | HHPA | ABGMA Oligomer | Ag flake | 0.9 | 0.34 | 1360 |

TABLE 1-continued

| Example | Anhydride Curing Agent[a] | Polymer additive[c] | Conductive Metal Filler | TGA Rt-250° % wt loss | TGA Isothermal/ hr, 180° C. | Shear strength, Psi |
|---|---|---|---|---|---|---|
| 7 | DDSA | n-BuMA polymer | Au-coated Ag Flake/powder | 0.55 | 0.16 | 1350 |

[a]HHPA = Hexahydrophthalic anhydride; DDSA = Dodecenyl succinic anhydride; MeHHPA = 4-Methyl Hexahydrophthalic anhydride.
b. Epoxide = 1,3-bis(glycidoxypropyl) tetramethyldisiloxane
[c]nBuMA poly. = Poly(n-butyl methacrylate), intrinsic viscosity about 0.5,
PMMA = Poly (methyl methacrylate), avg Mw 15,000
ABGMA polymer = Poly(acrylonitrile-co-butadiene-co-acrylic acid, dicarboxy terminated glycidyl methacrylate diester (ABA-glycidyl methacrylate diester).

The representative conductive adhesives described for use as improved thermal interface materials with heat dissipation elements generally provide low modulus cured adhesives having room temperature modulus of 8000-40,000. They have a high conductive filler loading without causing brittlenss and provide high thermal conductivity and higher electrical conductivity as compared to the high modulus commercial Ag-filled epoxies.

The paste compositions chemistry and viscosity can be adjusted to obtain thin bond line without voids, defects or resin bleed. There is no significant change in contact resistance or interfacial voids/defects observed on thermal cycling at 0-100° C., 500-1000 cycles. The epoxy matrix has been modified by incorporation of a low Tg polymeric and/or oligomeric system to confer special properties to the cured conductive epoxy polymer, low stress/flexibility/compliance, minimal change in shear strength upon exposure to reliability stress environment, and long term heat dissipation performance of cooling elements.

The conductive adhesives offer potential for enhanced thermal performance by incorporation of a phase change material (PCM) as additive in the matrix or by lamination of the preform. A practical method is provided for reworking/removing these cured adhesives from heat sinks, silicon device chip, and in plastic package assembly products which offers a major benefit of component reclaim, defect repair, and cost reduction by yield loss recovery through rework.

As a representative example, liquid siloxane epoxide precursor, 1,3-bis(glycidoxypropyl) tetramethyl disiloxane, and the anhydride curing agent which may be liquid or low melting solid, are mixed together in the preferred mole ratio of the anhydride curing agent to the epoxy equivalent in the range 1:1 to 1:2, respectively. When using a mixture of two anhydrides, the relative ratio of the anhydrides can be in the range 1:2 to 2:1. The mixture is stirred at about 50-70° C. for 30 minutes to completely dissolve the anhydride in the siloxane epoxide. The polymer additive, poly(n-butyl methacrylate) or poly(methyl methacrylate) or ABA-glycidyl methacrylate diester is then added to the epoxide-anhydride solution in an amount such that it is present in an amount 5 to 20 wt % based on the total organic binder which includes siloxane epoxide, anhydride, polymer additive, and the cure catalyst, and the mixture is stirred for several hours at 50-70° C. until the polymer essentially dissolves and a homogeneous clear viscous solution is formed.

This mixture is then allowed to cool to room temperature and the cure catalyst system is added which are commonly used in epoxy-anhydride cure and which includes a tertiary amine, typically, 2,4,6-tris(dimethylaminomethyl) phenol, benzyldimethyl amine (BDMA), and a proton source as nonylphenol, ethylene glycol and related materials. All the organic components are thoroughly mixed together and the catalyzed system can either be used immediately for dispersing the metal filler to form conductive paste or it can be stored at −20 or −40° C. for later use. Conductive metal filler is then added in portions to the above catalyzed organic carrier composition with constant mixing with a rotary mixer, the amount of metal filler added varies between 70-85 wt % depending on the filler type, to obtain paste viscosity such that it is suitable for screen printing and for syringe dispensing. The stirring rate is maintained for steady mixing without causing excessive entrapment of air bubbles. After a homogeneous paste consistency is obtained for a desired application, the paste is deaireated to remove any trapped air bubbles and then stored at a minimum of −40° C. when not in use.

To thermally cure the metal filled adhesives described above, the paste is applied as a thin layer onto a substrate, for example, ceramic, silicon, Au surface, and Pb/Sn solder, and cured in an oven preheated at 100° C. under $N_2$, and the adhesive paste is cured at 100-110° C. for about 30 minutes followed by 160-170° C. for 60 minutes, the heat was then turned off and the cured adhesive samples were allowed to cool to room temperature in the oven. To obtain free standing films for measurement of elastic modulus, the conductive formulations are cured in a mold made of a material having low energy surface, the mold having known depth, width and length is typically made of Teflon, by dispensing the adhesive paste in to the mold and curing at 100-110° C. for about 30 minutes followed by 160-170° C. for about 60-90 minutes. After cooling to room temperature, the cured samples are removed from the mold and characterized for elastic modulus according to the standard methods using instron tensile test.

The following are examples of the representative adhesive compositions shown in Table 1:

EXAMPLE 1

A soluble mixture of 7.8 g of a 1,3-bis(glycidoxypropyl) tetramethyl disiloxane and 1.3 g poly(n-butylmethacrylate) was prepared by heating with stirring at 70° C., then 2.2 g MeHHPA and 2.5 g HHPA was added and again allowed to stir until a clear mixture was formed. To this mixture was added 0.14 g nonylphenol+0.05 g ethylene glycol, and 0.03 g of the tertiary amine 2,4,6-tris(dimethylamino-methyl) phenol (DMP-30) and thoroughly mixed to form a clear homogeneous blend. About 65.5 g of Au-coated Ag filler were blended in this catalyzed mixture to form screenable conductive adhesive paste having about 82.5 wt % filler loading. The material was characterized for relevant properties and tested as a thermal interface material in conjunction with a SiSiC heat spreader. The data is summarized in table 1.

EXAMPLE 2

This example was a repeat of Example 1 except that in addition to MeHHPA and HHPA, about 0.2 g of methylnadic anhydride (NMA) was added to the composition described in Example 1. The filler type and % loading were kept the same. Relevant data on the characterization of the cured adhesive derived from this conductive paste are shown in table 1.

EXAMPLE 3

A soluble mixture of 17.5 g of a 1,3-bis(glycidoxypropyl) tetramethyl disiloxane, and 3.2 g of poly(n-butylmethacrylate) prepared according the method of Example 1. To 7.2 g of this mixture was added 5.5 g DDSA and 0.5 g MA, stirred to dissolve contents, and the catalyst system, 0.1 g nonylphenol and 0.15 g of 2,4,6-tris(dimethylaminomethyl) phenol (DMP-30) were added and thoroughly mixed to form a clear homogeneous blend. To obtain the conductive paste, about 65 g of Ag/Au filler (90% Ag/10% Au wt % ratio), described in Example 1, was blended in this catalyzed mixture. The material was characterized for relevant properties and tested as a thermal interface material in conjunction with a SiSiC heat spreader. The data is summarized in table 1.

EXAMPLE 4

Dodecenylsuccinic anhydride (DDSA), 2.6 g was added to a solution of about 2.8 g of 1,3-bis(glycidoxy-propyl) tetramethyldisiloxane and 0.6 g of poly(n-butyl methacrylate) prepared by dissolving the polymer in the liquid siloxane epoxide, and heated at 50° C. with stirring until a clear viscous solution was formed. The solution was allowed to cool to room temperature and then 0.035 g of nonylphenol, 0.025 g of ethylene glycol and 0.06 g 2,4,6-tris(dimethylaminomethyl)phenol (DMP-30) were added and well mixed to form a clear homogeneous solution. To about 3.8 g of the final catalyzed mixture was blended in 14.6 g Ag/Pd metal filler according to the method described in the above examples to form a conductive adhesive paste having about 79.4% (wt %) filler loading.

EXAMPLE 5

A mixture of 3.2 g of a 1,3-bis(glycidoxypropyl)tetramethyl disiloxane and 0.7 g of poly(ABA-glycidyl methacrylate oligomer) was allowed to stir until a clear blend was formed and then 2.2 g hexahydrophthalic anhydride solid (HHPA) was added and the mixture allowed to stir for about 30 minutes until a clear viscous solution formed. To this mixture was added 0.05 g nonylphenol, 0.02 g ethylene glycol and 0.045 g DMP-30 and the contents thoroughly mixed till it formed a clear homogeneous solution. About 27 g of Ag/Au filler (90% Ag/10% surface coated Au, wt % ratio) was blended in this catalyzed mixture according to general method described above to form a conductive adhesive paste having about 81.6 wt. % conductive particles. The paste was characterized for properties relevant to application as a thermal interface adhesive and functionally tested in heat sink attachment for shear strength and its durability under stress. The data is collected in table 1.

EXAMPLE 6

A mixture of 3.57 g of a 1,3-bis(glycidoxypropyl)tetramethyl disiloxane and 0.73 g of poly(ABA-glycidyl methacrylate oligomer) was allowed to stir until a clear blend was formed and then 2.1 g 4-methyl hexahydrophthalic anhydride was added and the mixture allowed to stir for about 30 minutes when a clear viscous solution formed. To about 3.2 g of the mixture was added 0.04 g nonylphenol, 0.04 g ethylene glycol and 0.07 g DMP-30 and the contents thoroughly mixed till it formed a clear homogeneous solution. About 21 g of Ag flake SF9AL was blended into the organic mixture to form a conductive paste of desired viscosity.

EXAMPLE 7

Example 4 was repeated exactly as described in terms of the catalyzed binder system with the difference that the filler used was Ag coated Au with about 81.5% (wt %) filler loading. Table 1 shows the relevant properties of the conductive adhesive.

Rework is another aspect of the present invention. Microelectronics fabrication processes often require disassembly of assembled components. Typical reasons include carrying out diagnostic tests, to replace or repair the semiconductor device, or to recover electrically good substrates from test vehicles or early user hardware used to assess product performance and reliability prior to actual product release. FIG. 1 shows a typical single chip module 10 having a ceramic chip carrier or substrate 11 with a single chip 12 attached through solder joints 13, which are encapsulated with an underfill polymer 14. For heat dissipation from the functioning device, a thermal interface material layer 15 (TIM) of the present invention is dispensed on the back side surface of the chip 12 and a metal heat sink or a metal plate 16 is bonded to the die with the conductive adhesive 15 as the thermal interface material for heat sink attached assembly.

Figure 2:
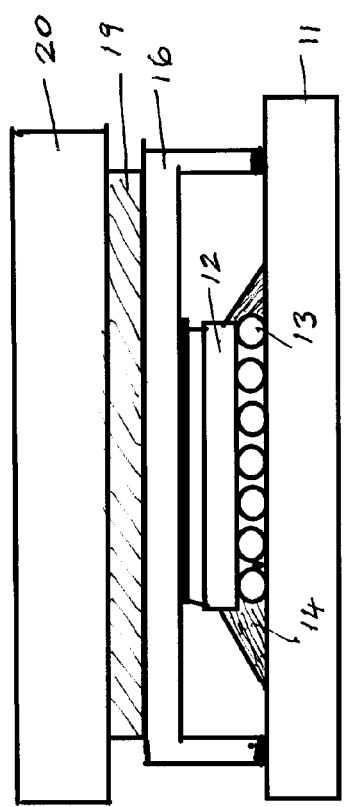
FIG. 2 is a cross section of a single chip module with a protective cap where the protective cap is attached to the back of the chip using a silicone polymer adhesive and a heat sink is attached to the protective cap using conductive adhesive as thermal interface between the cap and the heat sink.
Figure 3:
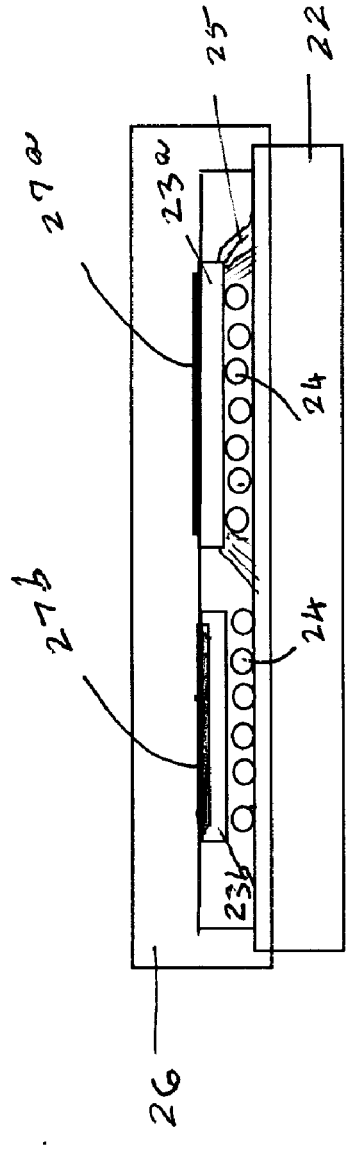
FIG. 3 is a cross section of a dual chip module with a single heat spreader attached to the back of the two chips using conductive adhesive as thermal interface material where one chip can have a thin bondline and the second chip has a thicker bondline.
Figure 4:
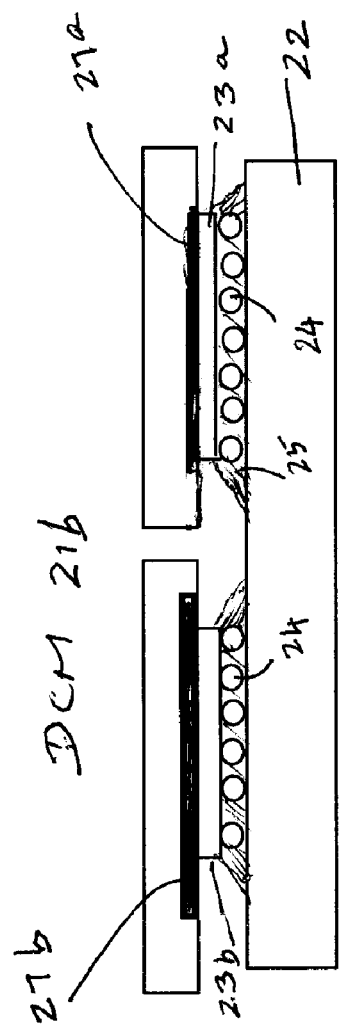
FIG. 4 is a cross section of a dual chip module with two separate heat spreaders bonded to each chip using conductive adhesive as interface material.

FIG. 2 shows a conventional single chip module assembly as in FIG. 1 but additionally shows a protective cap 16 attached to the substrate with an elastomeric silicone polymer adhesive and a heat sink or heat slug 20 attached to the protective cap 16 with a conductive adhesive as the thermal interface material 19. FIGS. 3 and 4 show a dual chip module (DCM) represented in two versions as 21a and 21b. A ceramic chip carrier or substrate 22 with two chips 23a and 23b attached through solder joints 24 is shown with the solder joints being encapsulated with an epoxy encapsulant 25. A single protective metal cap 26 is bonded to the substrate with an elastomeric silicone polymer adhesive.

The silicon chips 23a and 23b mounted on the chip carrier in flip-chip configuration contact with the metal cap through bonding with the conductive epoxy adhesive as the thermal interface material 27a and 27b. The two adhesives can both be the conductive adhesives of the present invention, or one can be a conventional material such as a conductive silicone polymer and the second can be one of the TIM disclosed according to the present invention.

The chip size can be different, for example, one chip 15.4 by 17.9 mm and the second chip smaller, 13.2 by 15.9 mm, the substrate size 42.5 by 42.5 mm. FIG. 4 shows a ceramic chip carrier or substrate 22 with two chips 23a and 23b attached through solder joints 24 with the solder joints being encapsulated with an epoxy encapsulant 25. The chip 23a is a lower power chip to which a metal plates/heat sink is directly attached (DLA) with a conventional silicone adhesive 27a, and the chip 23b is a high power chip to which a heat sink is attached using the high thermal conductivity interface polymeric adhesives 27b.

Figure 5:
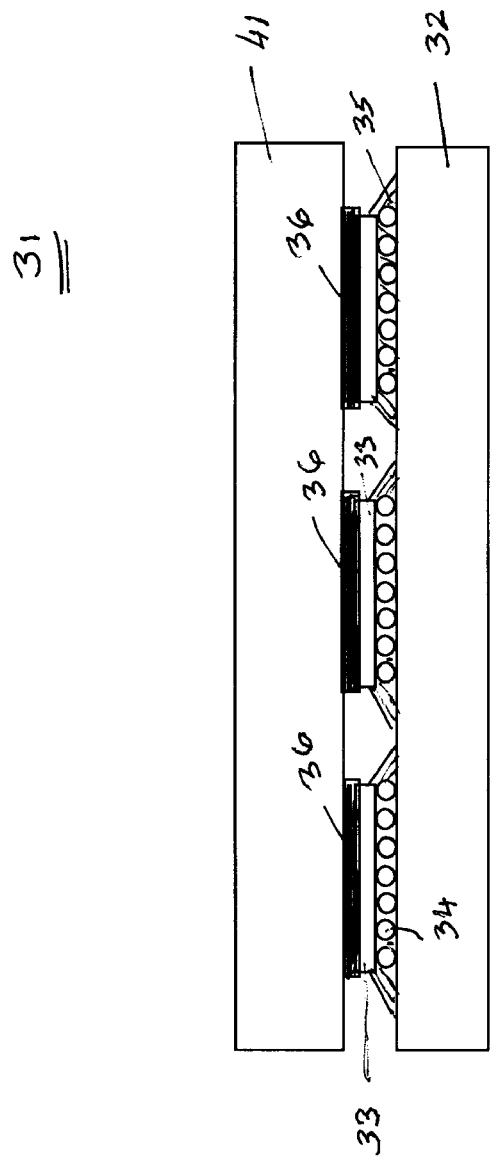
FIG. 5 is a cross section of a multichip module with a metal plate attached to the back of the chips with a conductive adhesive as thermal interface material.

FIG. 5 illustrates a typical multi-chip module (MCM) 31 where a ceramic chip carrier substrate 32 is connected to a plurality of chips 33 through solder joints 34 with the epoxy encapsulant 35 covering the solder joints. A thermal paste or a conductive epoxy thermal interface compound 36 of the present invention is shown as the adhesive interface material on the back side surface of silicon chips 33 for heat sink attachment to provide the necessary cooling or heat dissipation from the chip.

Figure 6:
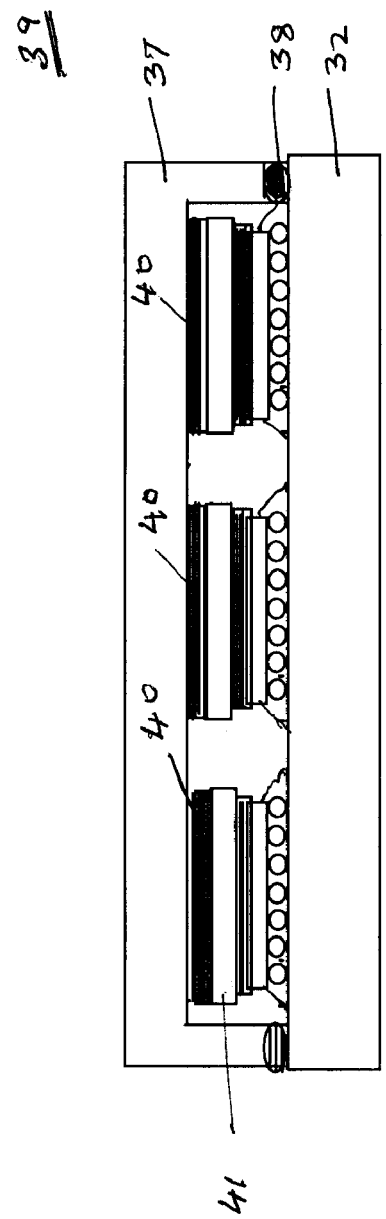
FIG. 6 is a cross section of a multichip chip module with a heat spreader attached to the back of the chips using a conductive adhesive as thermal interface and a protective cap attached using a silicone polymer adhesive.

FIG. 6 shows a protective cap 37 attached to chip carrier 32 with a polymer adhesive 38. FIG. 6 is an illustration of the MCM of FIG. 5 shown generally as 39 having a metal heat sink 41 attached to the protective cap 37 with a thermally and electrically thermal interface adhesive 40.

A representative heat spreader/module assembly process using these reworkable conductive adhesives as thermal interface involves the steps of:

applying a thin layer of conductive paste by dispensing or screen printing onto the back of device chips mounted on the chip carrier or the conductive adhesive can be dispensed on the heat spreader, or it can be dispensed on both the heat spreader and the device chip back side;

securing the adhesive coated chip/module assembly in a clamping fixture with slots matching the substrate size;

aligning the heat spreader with back of the chips and placing in contact with the adhesive coated chip surface and clamping the assembly to prevent component movement and provide pressure during subsequent curing;

placing the assembly in a preheated oven at 90-100° C., holding at this temperature for 45 minutes, then ramping the temperature to 160-170° C. and holding at this temperature for 60-90 minutes for complete cure of the interface adhesive.

Removal processes for various assembly materials must be selective for a particular material set and cause no detriment to the substrate integrity and electrical performance. It is also required that the removal method be environmentally and chemically suitable for use in a manufacturing environment.

Unlike the commercial Ag-filled mostly non-reworkable thermal interface epoxy adhesives, the cured conductive adhesives disclosed according to the present invention for improved thermal interface materials can be easily reworked by subjecting the component carrying the adhesive residue to a dilute solution of a quaternary ammonium fluoride, preferably tetrabutylammonium fluoride (TBAF) 1-2 wt % in a non-polar aprotic solvent, preferably in the presence of a surface active agent comprising a non-ionic surfactant or a combination of an amphoteric and a non-ionic surfactant, under very mild conditions requiring less than 10-20 minute immersion time at 40-50° C., followed by rinsing with a low boiling hydroxylic solvent, typically IPA followed by dry and bake.

Rework methods for Sylgard and related cured silicone polymers using TBAF based compositions has been detailed in the U.S. Pat. No. 6,652,665. According to the present invention, it is discovered that the cured conductive adhesives described here can also be reworked with the TBAF derived solutions found effective in removing Sylgard residues from various component surfaces.

Therefore, by providing the adhesives reworkability option, the present invention offers an opportunity to rework and recover high cost electronic components such as high performance heat sinks, allow defect repair to recover yield loss and reduce product cost, and reclaim test vehicles which are currently discarded for lack of a suitable rework The method is based on non-alkaline or mildly alkaline solution chemistry and has no environmental and health hazard concerns, no chemical safety or flammability issues for use in manufacturing environment. It is compatible with all type sensitive metallurgical interconnections including conventional C4s and Pb-free joints.

In this additional embodiment, the present invention provides an improved method of removing cured conductive polymer adhesives which are disclosed here as thermal interface materials from electronic components to offer an option for rework, to repair defects, and for reclamation or recovery of usable parts of the assembly products, particularly the high cost heat sinks and other module components. Yet another attribute of the rework chemistry found effective in stripping conductive adhesive layer as thermal interface is its compatibility with ceramic modules carrying silicon device chips as well as with plastic packages.

The rework method comprises the steps of:

(a) providing a first stripping solution for the thermal interface coating deposit on a heat sink which comprises tetramethylammonium fluoride (TMAF) or tetrabutylammonium fluoride (TBAF), or a mixture thereof dissolved in a first essentially water insoluble non-hydroxylic aprotic solvent, for example, propylene glycol methyl ether acetate (PGMEA)

(b) submerging the electronic components carrying the cured coating/residue of conductive adhesive thermal interface material in the first cleaning solution heated at 40 to 70° C., preferably 45 to 60° C. and allowing the components to be subjected to the cleaning action by the solution with stirring or agitation for a first predetermined period of time between about 10 to about 90 minutes, depending on the extent of polymer residue and the component surface topography;

(c) removing the assembly components from the first cleaning solution;

(d) transporting and submerging the composition in the first solvent rinse bath which comprises a hydrophobic non-hydroxylic solvent, preferably the same solvent as used for the first cleaning solution, and subjecting the components to the solvent rinse, for example, immersion rinse at room temperature to 70° C. with agitation, for a second predetermined period of time between about 5 to about 15 minutes, to replace the cleaning solution on the component surface with the solvent;

(e) removing the components from the first solvent rinse bath;

(f) transporting and submersing the components to the second solvent rinse bath which comprises a hydrophilic essentially water soluble solvent, and subjecting the components or parts to the second solvent rinse at room temperature to about 60° C. with agitation such as stirring or immersion spray for about 5 to 10 minutes;

(g) removing the components from the second solvent rinse bath;

(h) transporting the components to an aqueous rinse bath and applying a water rinse, preferably deionized water rinse, for example, spray or immersion spray rinse, at room temperature to about 50° C. for 2 to 10 minutes;

(i) subjecting the components to another brief rinsing step with IPA (isopropanol) to replace water on the component surface with IPA to accelerate drying;

(j) drying the components by blowing dry $N_2$ or air on the surfaces and then heating the assembly components at about 90° C. to about 120° C. for 30 minutes to about one hour, preferably under vacuum to remove adsorbed moisture from the components.

In an alternative solvent rinse process, the assembly components or parts after the first solvent rinse in non-hydroxylic aprotic solvent such as PMA, are transported to a second solvent bath also containing a hydrophobic non-hydroxylic solvent, preferably the same solvent as used for the first cleaning solution and the first rinse solvent such as PMA, and subjecting the parts to the second solvent rinse similar to the first solvent rinse. After the second solvent rinse, the assembly components are transported to a bath containing IPA where the parts are subjected to a spray rinse or immersion rinse with IPA to replace the PMA solvent with IPA, and then dried by blowing dry $N_2$ or air on the surface followed by heating the component parts at about 90° C. to about 120° C. for 30 minutes to one hour, preferably under vacuum.

The preferred quaternary ammonium fluoride (QAF) compound in the first cleaning solution is tetramethylammonium fluoride (TMAF), tetrabutylammonium fluoride (TBAF), tetraoctylammonium fluoride or a mixture thereof, which is present at a concentration of about 0.2 to 5 weight %, preferably 0.5 to 1% based on the formula $(C_4H_9)_4N^+F^-$, or 0.6 to 1.5% (weight %) as the trihydrate (TBAF.$3H_2O$) in hydrophobic aprotic solvent, preferably propylene glycol methyl ether acetate (PMA). Other solvents as replacement of PMA include tetrahydrofuran (THF), acetonitrile, chlorobenzene etc.

The first solvent rinse bath comprises a non-hydroxylic aprotic solvent which is preferably the same solvent as in the first cleaning solution solvent in the category of propylene glycol alkyl ether alkoate selected from the group consisting of propylene glycol methyl ether acetate (PMA), propylene glycol ethyl ether acetate (PGEEA, bp. 158° C.), propylene glycol methyl ether propionate (methotate), di(propylene glycol) methyl ether acetate (DPMA, bp. 200° C.), ethoxy ethyl propionate (EEP).

The second rinse solvent is a hydrophilic essentially water soluble solvent represented by propylene glycol alkyl ethers selected from the group consisting of di(propylene glycol) methyl ether (DPM, fp 75° C.), tri(propylene glycol) monomethyl ether (TPM, fp 96° C.), tri(propylene glycol) n propyl ether, or a mixture thereof, used at a temperature from about room temperature to about 60° C.

In the alternative solvent rinse process, the parts after the first solvent rinse in PMA or related non-hydroxylic aprotic solvent are again subjected to the same solvent rinse, preferably PMA in a second solvent bath followed by spray or immersion rinse in IPA, and dried by blowing dry $N_2$ or air on the surfaces followed by heating the component parts at about 90° C. to about 120° C. for 30 minutes to one hour, preferably under vacuum.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. A method for making a conductive adhesive composition comprising the steps of:
    mixing a liquid epoxy precursor and a polymer additive to form a first mixture;
    stirring said first mixture at at least room temperature until it forms a first homogeneous blend;
    adding a anhydride curing additive to said first homogeneous blend to form a second mixture;
    stirring said second mixture at at least room temperature until it forms a second homogeneous blend;
    adding a epoxy curing catalyst to said second homogeneous blend to form a third mixture;
    stirring said third mixture until it forms a third homogeneous blend, and
    adding conductive filler particles in said third homogeneous blend to form a conductive adhesive composition,
    wherein:
        said liquid epoxy precursor is a soluble mixture of 1,3-bis(glycidoxypropyl) tetramethyl disiloxane and said polymer additive is oligomeric ABA-glycidyl methacrylate diester and said first mixture is prepared by heating with stirring at approximately 50° C.;
        said anhydride curing additive is HHPA, or a mixture of HHPA and MeHHPA;
        said epoxy curing catalyst is nonylphenol+ethylene glycol, and the tertiary amine 2,4,6-tris(dimethylamino-methyl)phenol; and
        said conductive filler particles are Au-coated Ag, Pd-coated Ag filler, Ag flake, or a combination thereof blended to form screenable conductive adhesive paste.

* * * * *